(12) United States Patent
Levesque et al.

(10) Patent No.: US 8,686,381 B2
(45) Date of Patent: Apr. 1, 2014

(54) SOURCE-COLLECTOR MODULE WITH GIC MIRROR AND TIN VAPOR LPP TARGET SYSTEM

(75) Inventors: Richard Levesque, Livermore, CA (US); Natale M. Ceglio, Pleasanton, CA (US); Giovanni Nocerino, Pleasanton, CA (US); Fabio Zocchi, Samarate (IT)

(73) Assignee: Media Lario S.R.L., Bosisio Parini (LC) (IT)

( * ) Notice: Subject to any disclaimer, the term of this patent is extended or adjusted under 35 U.S.C. 154(b) by 643 days.

(21) Appl. No.: 12/803,461

(22) Filed: Jun. 28, 2010

(65) Prior Publication Data

US 2011/0318694 A1    Dec. 29, 2011

(51) Int. Cl.
*H05G 2/00* (2006.01)

(52) U.S. Cl.
USPC .................................. 250/504 R; 355/67

(58) Field of Classification Search
USPC .................................. 250/504 R; 355/67
See application file for complete search history.

(56) References Cited

U.S. PATENT DOCUMENTS

| | | | |
|---|---|---|---|
| 2002/0014599 A1 | 2/2002 | Birx et al. | |
| 2004/0183030 A1 | 9/2004 | Roux | |
| 2007/0023709 A1 | 2/2007 | Kanazawa et al. | |
| 2007/0045573 A1 | 3/2007 | Kleinschmidt et al. | |
| 2008/0087840 A1 | 4/2008 | Soumagne et al. | |
| 2010/0264336 A1 | 10/2010 | Neff | |
| 2010/0288937 A1* | 11/2010 | Watanabe et al. | 250/372 |
| 2010/0303199 A1 | 12/2010 | Wallhead et al. | |
| 2011/0101863 A1 | 5/2011 | Endo et al. | |
| 2011/0284774 A1 | 11/2011 | Ishihara et al. | |
| 2012/0097869 A1 | 4/2012 | Ueno et al. | |
| 2012/0147349 A1* | 6/2012 | Van Dijsseldonk et al. | 355/67 |
| 2012/0280149 A1 | 11/2012 | Mestrom et al. | |
| 2013/0126762 A1 | 5/2013 | Moriya et al. | |
| 2013/0146682 A1 | 6/2013 | Ishihara et al. | |

FOREIGN PATENT DOCUMENTS

JP    2009104924    5/2009

OTHER PUBLICATIONS

Examination Report (Novelty Search Report and Written Opinion), Netherlands Patent App. 2006994, published on Jul. 26, 2013, by the Netherlands Patent Office.
Translation of Examination Report (Novelty Search Report and Written Opinion) for Netherlands Patent App. 2006994, published on Jul. 26, 2013, by the Netherlands Patent Office.

* cited by examiner

*Primary Examiner* — Michael Maskell
(74) *Attorney, Agent, or Firm* — Opticus IP Law PLLC

(57) ABSTRACT

A source-collector module (SOCOMO) for generating a laser-produced plasma (LPP) that emits EUV radiation, and a grazing-incidence collector (GIC) mirror arranged relative to the LPP and having an input end and an output end. The LPP is formed using an LPP target system having a light source portion and a target portion, wherein a pulsed laser beam from the light source portion irradiates Sn vapor from a Sn vapor source of the target portion. The GIC mirror is arranged relative to the LPP to receive the EUV radiation at its input end and focus the received EUV radiation at an intermediate focus adjacent the output end. A radiation collection enhancement device may be used to increase the amount of EUV radiation provided to the intermediate focus. An EUV lithography system that utilizes the SOCOMO is also disclosed.

27 Claims, 11 Drawing Sheets

US 8,686,381 B2

SOURCE-COLLECTOR MODULE WITH GIC MIRROR AND TIN VAPOR LPP TARGET SYSTEM

FIELD

The present disclosure relates generally to grazing-incidence collectors (GICs), and in particular to a source-collector module for use in an extreme ultraviolet (EUV) lithography system that employs a laser-produced plasma (LPP) target system that uses tin (Sn) vapor to generate EUV radiation.

BACKGROUND ART

Laser-produced plasmas (LPPs) are formed in one example by irradiating Sn droplets with a focused laser beam. Because LPPs radiate in the extreme ultraviolet (EUV) range of the electromagnetic spectrum, they are considered to be a promising EUV radiation source for EUV lithography systems.

FIG. 1 is a schematic diagram of a generalized configuration for a prior art LPP-based source-collector module ("SOCOMO") 10 that uses a normal-incidence collector ("NIC") mirror MN, while FIG. 2 is a more specific example configuration of the "LPP-NIC" SOCOMO 10 of FIG. 1. The LPP-NIC SOCOMO 10 includes a high-power laser 12 that generates a high-power, high-repetition-rate laser beam 13 having a focus F13. LPP-NIC SOCOMO 10 also includes along an axis A1 a fold mirror FM and a large (e.g., ~600 mm diameter) ellipsoidal NIC mirror MN that includes a surface 16 with a multi-layer coating 18. The multilayer coating 18 is essential to guarantee good reflectivity at EUV wavelengths. LPP-NIC SOCOMO 10 also includes a Sn source 20 that emits a stream of tin (Sn) pellets 22 that pass through laser beam focus F13.

In the operation of LPP-NIC SOCOMO 10, laser beam 13 irradiates Sn pellets 22 as the Sn pellets 22 pass through the laser beam focus F13, thereby produce a high-power LPP 24. LPP 24 typically resides on the order of hundreds of millimeters from NIC mirror MN and emits EUV radiation 30 as well as energetic Sn ions, particles, neutral atoms, and infrared (IR) radiation. The portion of the EUV radiation 30 directed toward NIC mirror MN is collected by the NIC mirror MN and is directed (focused) to an intermediate focus IF to form an intermediate focal spot FS. The intermediate focus IF is arranged at or proximate to an aperture stop AS. Only that portion of the EUV radiation 30 that makes it through aperture stop AS forms focal spot FS. Here is it noted that focus spot FS is not an infinitely small spot located exactly at intermediate focus IF, but rather is a distribution of EUV radiation 30 generally centered at the intermediate focus IF.

Advantages of LPP-NIC SOCOMO 10 are that the optical design is simple (i.e., it uses a single ellipsoidal NIC mirror) and the nominal collection efficiency can be high because NIC mirror MN can be designed to collect a large angular fraction of the EUV radiation 30 emitted from LPP 24. It is noteworthy that the use of the single-bounce reflective NIC mirror MN placed on the opposite side of LPP 24 from the intermediate focus IF, while geometrically convenient, requires that the Sn source 20 not significantly obstruct EUV radiation 30 being delivered from the NIC mirror MN to the intermediate focus IF. Thus, there is generally no obscuration in the LPP-NIC SOCOMO 10 except perhaps for the hardware needed to generate the stream of Sn pellet 22.

LPP-NIC SOCOMO 10 works well in laboratory and experimental arrangements where the lifetime and replacement cost of LPP-NIC SOCOMO 10 are not major considerations. However, a commercially viable EUV lithography system requires a SOCOMO that has a long lifetime. Unfortunately, the proximity of the surface 16 of NIC mirror MN and the multilayer coatings 18 thereon to LPP 24, combined with the substantially normally incident nature of the radiation collection process, makes it highly unlikely that the multilayer coating 18 will remain undamaged for any reasonable length of time under typical EUV-based semiconductor manufacturing conditions.

A further drawback of the LPP-NIC SOCOMO 10 is that it cannot be used in conjunction with a debris mitigation tool based on a plurality of radial lamellas through which a gas is flowed to effectively stop ions and neutrals atoms emitted from the LPP 24 from reaching NIC mirror MN. This is because the radial lamellas would also stop the EUV radiation 30 from being reflected from NIC mirror MN.

Multilayer coating 18 is also likely to have its performance significantly reduced by the build-up of Sn, which changes the critical reflective properties of the multilayer coating 18. Also, the aforementioned energetic ions, atoms and particles produced by LPP 24 will bombard multilayer coating 18 and destroy the layered order of the top layers of the multilayer coating 18. In addition, the energetic ions, atoms and particles will erode multilayer coating 18, and the attendant thermal heating from the generated IR radiation can act to mix or interdiffuse the separate layers of the multilayer coating 18.

While a variety of fixes have been proposed to mitigate the above-identified problems with LPP-NIC SOCOMO 10, they all add substantial cost and complexity to module, to the point where it becomes increasingly unrealistic to include it in a commercially viable EUV lithography system. Moreover, the Sn droplet LPP EUV light source is a complex and expensive part of the LPP-NIC SOCOMO 10. What is needed therefore is a less expensive, less complex, more robust and generally more commercially viable SOCOMO for use in an EUV lithography system that uses a simpler and more cost-effective LPP-based EUV radiation source.

SUMMARY

The present disclosure is generally directed to grazing incidence collectors (GICs), and in particular to GIC mirrors used to form a source-collector module (SOCOMO) for use in EUV lithography systems, where the SOCOMO includes a LPP target system that uses Sn vapor and a laser to generate EUV radiation.

An aspect of the disclosure is a SOCOMO for an extreme EUV lithography system. The SOCOMO includes a laser that generates a pulsed laser beam, and a fold mirror arranged along a source-collector module axis and configured to receive the pulsed laser beam and reflect the pulsed laser beam down the source-collector module axis in a first direction. The SOCOMO also includes a Sn vapor source comprising a vapor oven having an interior and configured to convert liquid Sn or solid Sn in the vapor oven interior to Sn vapor and provide the Sn vapor to a gap where the Sn vapor is irradiated by the pulsed laser beam, thereby creating a LPP that generates EUV radiation in a second direction that is generally opposite the first direction. The SOCOMO also includes GIC mirror having an input end and an output end and arranged to receive the EUV radiation at the input end and focus the received EUV radiation at an intermediate focus adjacent the output end.

Another aspect of the disclosure is a method of collecting EUV radiation from a LPP. The method includes providing a GIC mirror along an axis, the GIC mirror having input and output ends. The method also include arranging adjacent the input end of GIC mirror an LPP target system configured to provide Sn vapor. The method further includes sending a pulsed laser beam down the axis of GIC mirror and through the GIC mirror from the output end to the input end and to the Sn vapor, thereby forming the LPP that emits the EUV radiation. The method also includes collecting with the GIC mirror at the input end of GIC mirror a portion of the EUV radiation from the LPP and directing the collected EUV radiation out of the output end of GIC mirror to form a focus spot at an intermediate focus.

Another aspect of the disclosure is a LPP target system. The system includes a laser that generates a pulsed laser beam, and a vacuum chamber having a chamber interior. The system also includes a temperature-controlled containment vessel arranged in the chamber interior. The temperature-controlled containment vessel has a containment vessel interior. A vapor oven is arranged in the containment vessel interior and has a housing that includes an opening and that defines an vapor oven interior. The vapor oven is configured to convert solid or liquid Sn in the vapor oven interior to Sn vapor. This Sn vapor flows out of the vapor oven interior through the opening and into a gap accessible to the pulsed laser beam. The system also includes an aperture formed in the vacuum chamber and temperature-controlled containment vessel. The aperture is configured so that the laser beam can travel through the aperture and to the Sn vapor that passes through the opening and into the gap, thereby generating the LPP.

Additional features and advantages of the disclosure are set forth in the detailed description below, and in part will be readily apparent to those skilled in the art from that description or recognized by practicing the disclosure as described herein, including the detailed description which follows, the claims, as well as the appended drawings.

Figure 1:
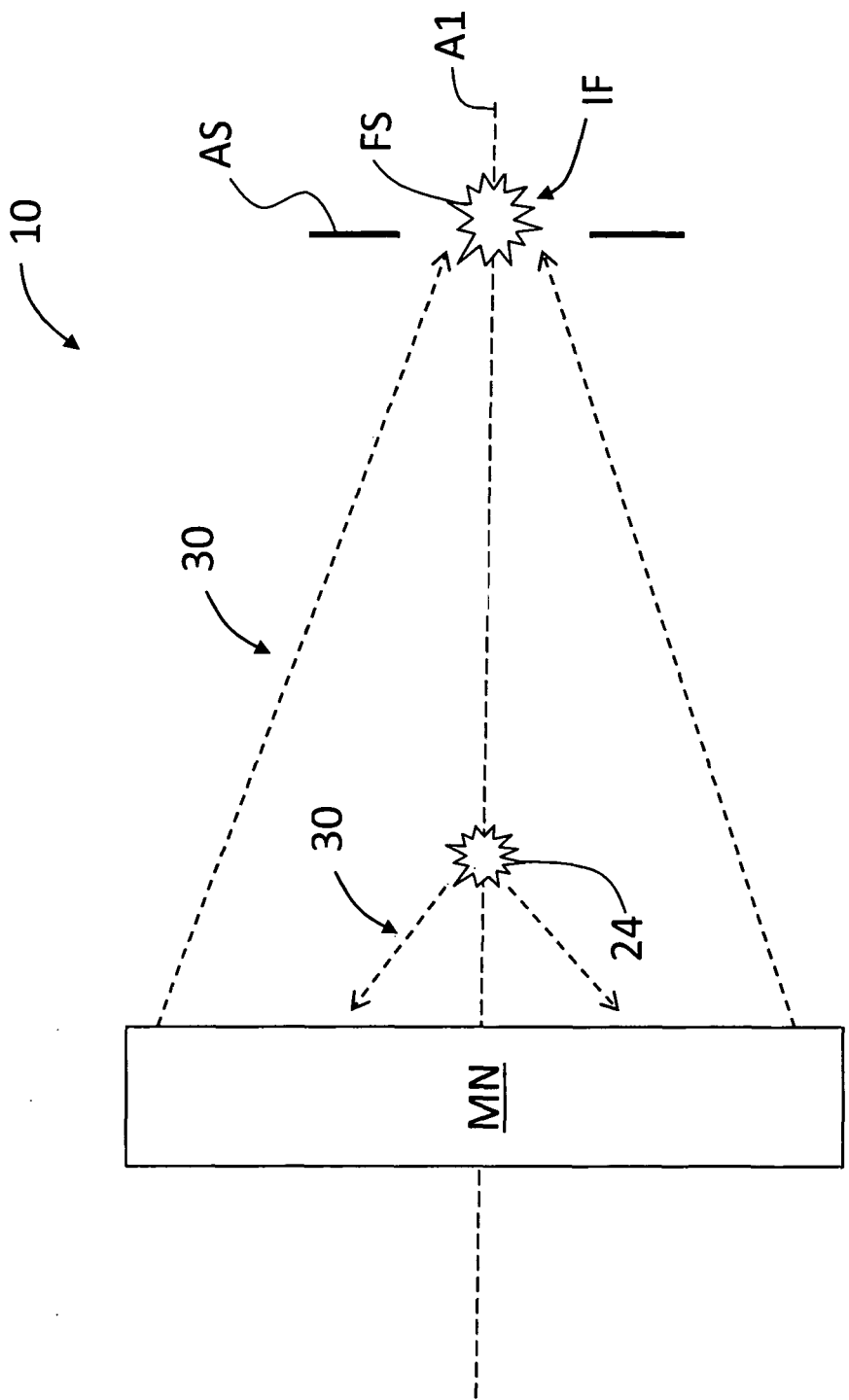
FIG. 1 is a schematic diagram of a generalized example prior art LPP-NIC SOCOMO.
Figure 2:
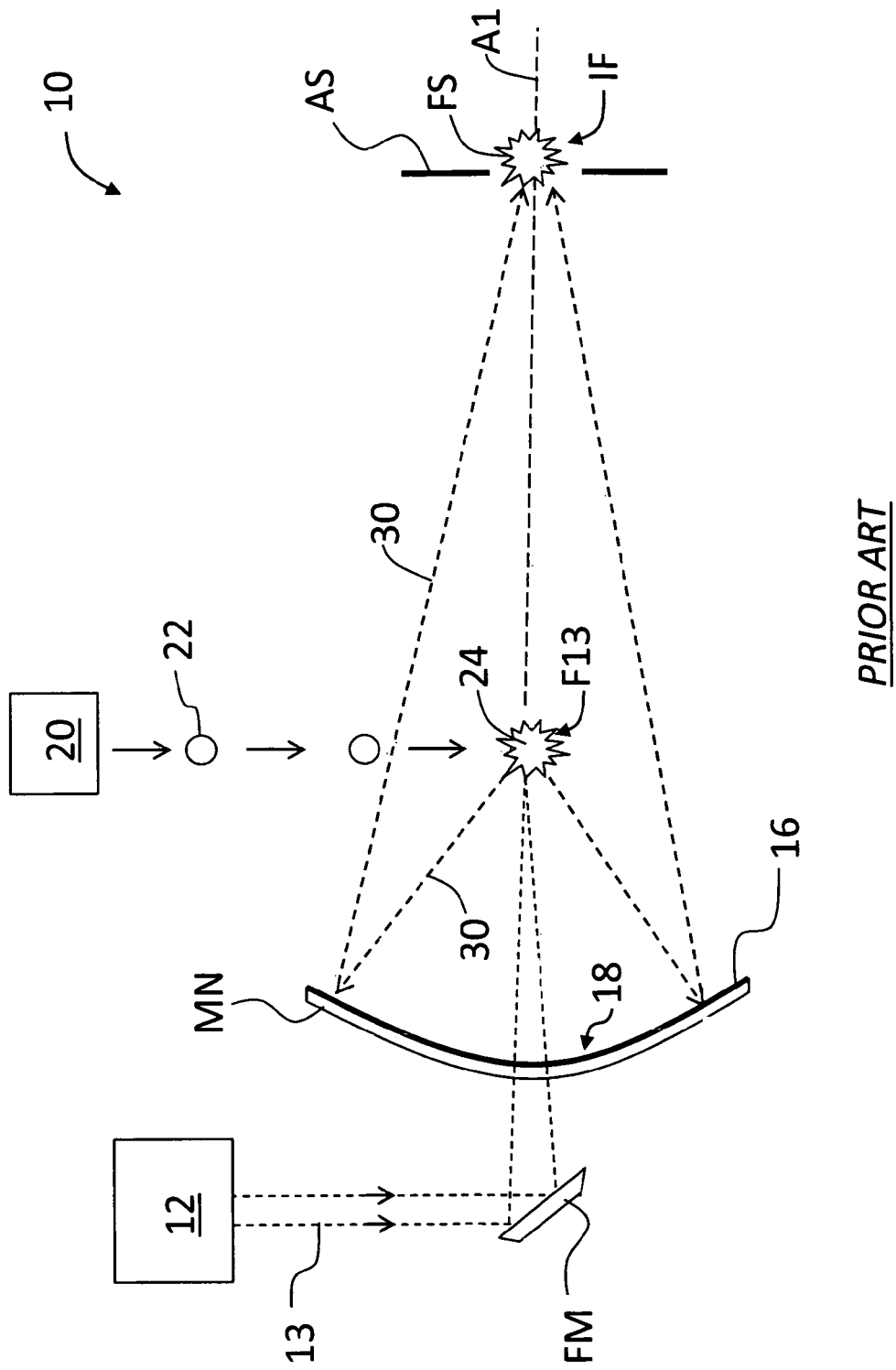
FIG. 2 is a schematic diagram of a particular example of a prior art LPP-NIC SOCOMO in accordance with FIG. 1.

The various elements depicted in the drawing are merely representational and are not necessarily drawn to scale. Certain sections thereof may be exaggerated, while others may be minimized. The drawing is intended to illustrate an example embodiment of the disclosure that can be understood and appropriately carried out by those of ordinary skill in the art.

DETAILED DESCRIPTION

The present disclosure is generally directed to GICs, and in particular to GIC mirrors used to form a source-collector module (SOCOMO) for use in EUV lithography systems that have a LPP-based EUV light source.

Figure 3A:
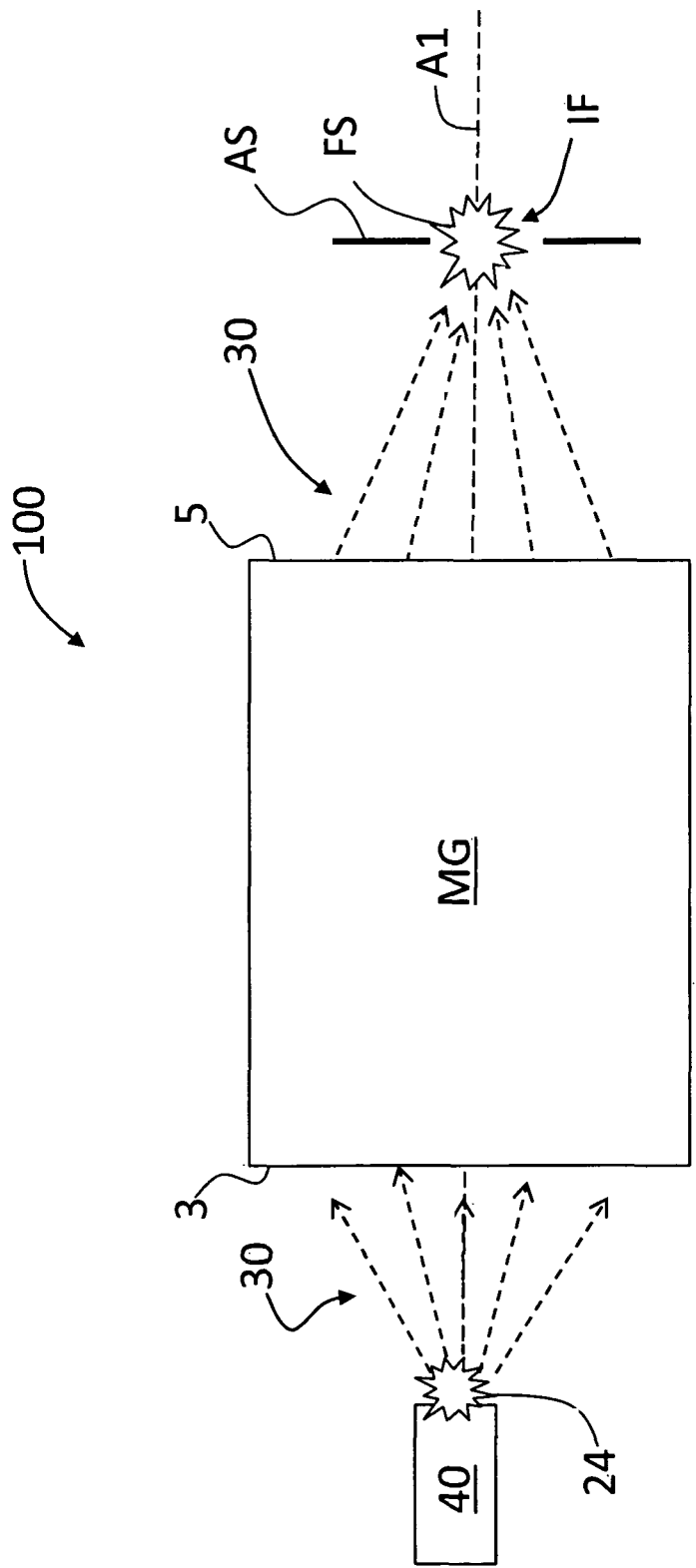
FIG. 3A is a generalized schematic diagram of an example GIC-based SOCOMO for an LPP source ("LPP-GIC SOCOMO"), wherein the LPP and intermediate focus are on opposite sides of the GIC mirror.
Figure 3B:
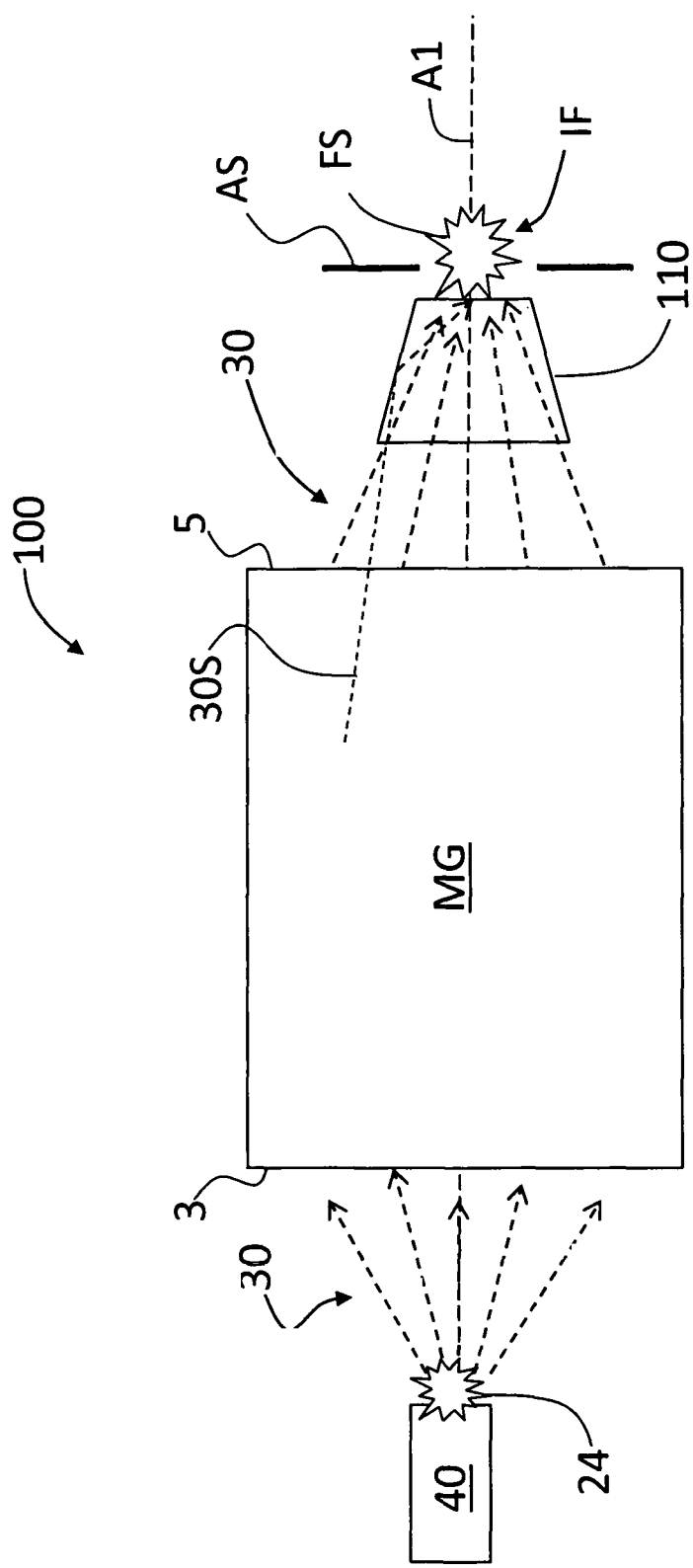
FIG. 3B is similar to FIG. 3A, wherein the LPP-GIC SOCOMO additionally includes an optional radiation collection enhancement device (RCED) arranged between the GIC mirror and the intermediate focus.

FIG. 3A and FIG. 3B are generalized schematic diagrams of example LPP-GIC SOCOMOs ("SOCOMOs") 100, wherein LPP 24 and intermediate focus IF are on opposite sides of a GIC mirror MG. GIC mirror MG has an input end 3 and an output end 5. An LPP target system 40 that generates LPP 24 is also shown, and an example of the LPP target system 40 is discussed in detail below. In FIG. 3B, LPP-GIC SOCOMO 100 further includes an optional radiation collection enhancement device (RCED) 110, such as described in U.S. Provisional Patent Application Ser. No. 61/341,806 entitled "EUV collector system with enhanced EUV radiation collection," which application is incorporated by reference herein. RCED 110 is arranged along optical axis A1 immediately adjacent intermediate focus IF and aperture stop AS on the GIC mirror MG side and is configured to increase the amount of EUV radiation 30 that makes it through the aperture stop AS to the intermediate focus IF to form focus spot FS. This is illustrated by a skew EUV ray 30S that is redirected by RCED 110 through aperture stop AS to form focus spot FS.

Figure 4:
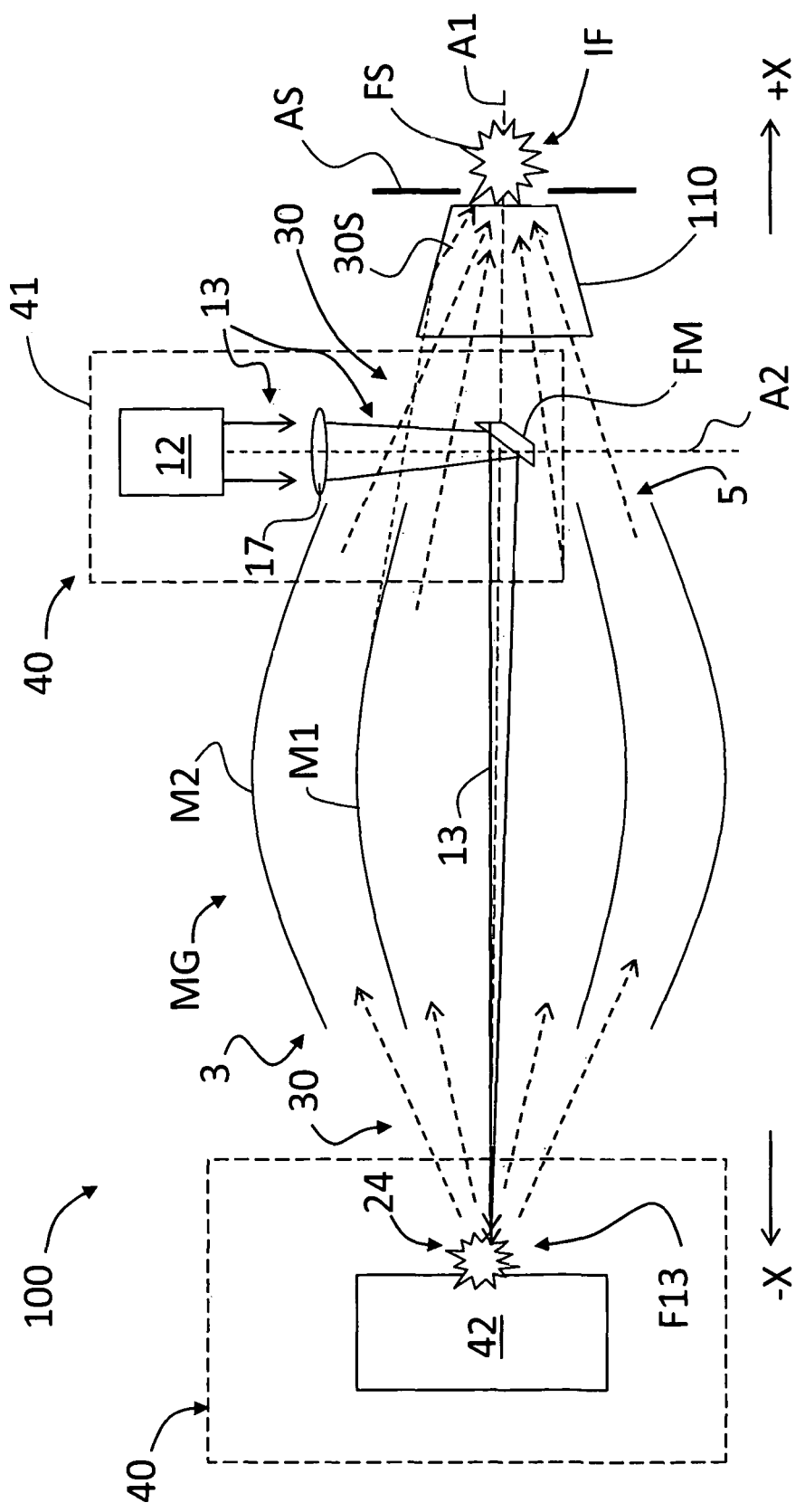
FIG. 4 is a schematic diagram of example LPP-GIC SOCOMO based on the generalized configuration of FIG. 3B, and showing the light source portion and the target portion of the LPP target system.

FIG. 4 is a schematic diagram of an example LPP-GIC SOCOMO 100 based on the general configuration of FIG. 3B. LPP-GIC SOCOMO 100 of FIG. 4 utilizes an LPP target system 40 that includes a light source portion 41 and a target portion 42. Light source portion 41 includes a laser 12 that generates a laser beam 13 along an axis A2 that is perpendicular to optical axis A1. Light source portion 41 also includes a fold mirror FM arranged along optical axis A1 at the intersection of axes A1 and A2, which intersection lies between GIC mirror MG and intermediate focus IF (e.g., between the GIC mirror MG and RCED 110). This allows for a configuration where a multi-shell GIC mirror MG (shown in FIG. 4 has having two GIC mirror shells M1 and M2 by way of example) is arranged along optical axis A1 between LPP 24 and intermediate focus IF. A lens 17 adjacent laser 12 assists in focusing laser beam 13 to a focus F13 at target portion 42 to form LPP 24, as discussed in greater detail below. In an example embodiment, GIC mirror shells M1 and M2 include Ru coatings (not shown) on their respective reflective surfaces, which coatings are relatively stable and can tolerate a certain amount of Sn coating from LPP 24.

Target portion 42 is irradiated by laser beam 13 traveling through GIC mirror MG in the −X direction along optical axis A1, thereby creating EUV radiation 30 that is emitted generally in the +X direction. The axial obscuration presented by fold mirror FM is minimal. Thus, laser beam 13 travels in one direction (i.e., the −X direction) through GIC mirror MG generally along optical axis A1 and EUV radiation 30 travels generally in the opposite direction (i.e., the +X direction) through the GIC mirror MG, RCED 110 and to intermediate focus IF.

Figure 5:
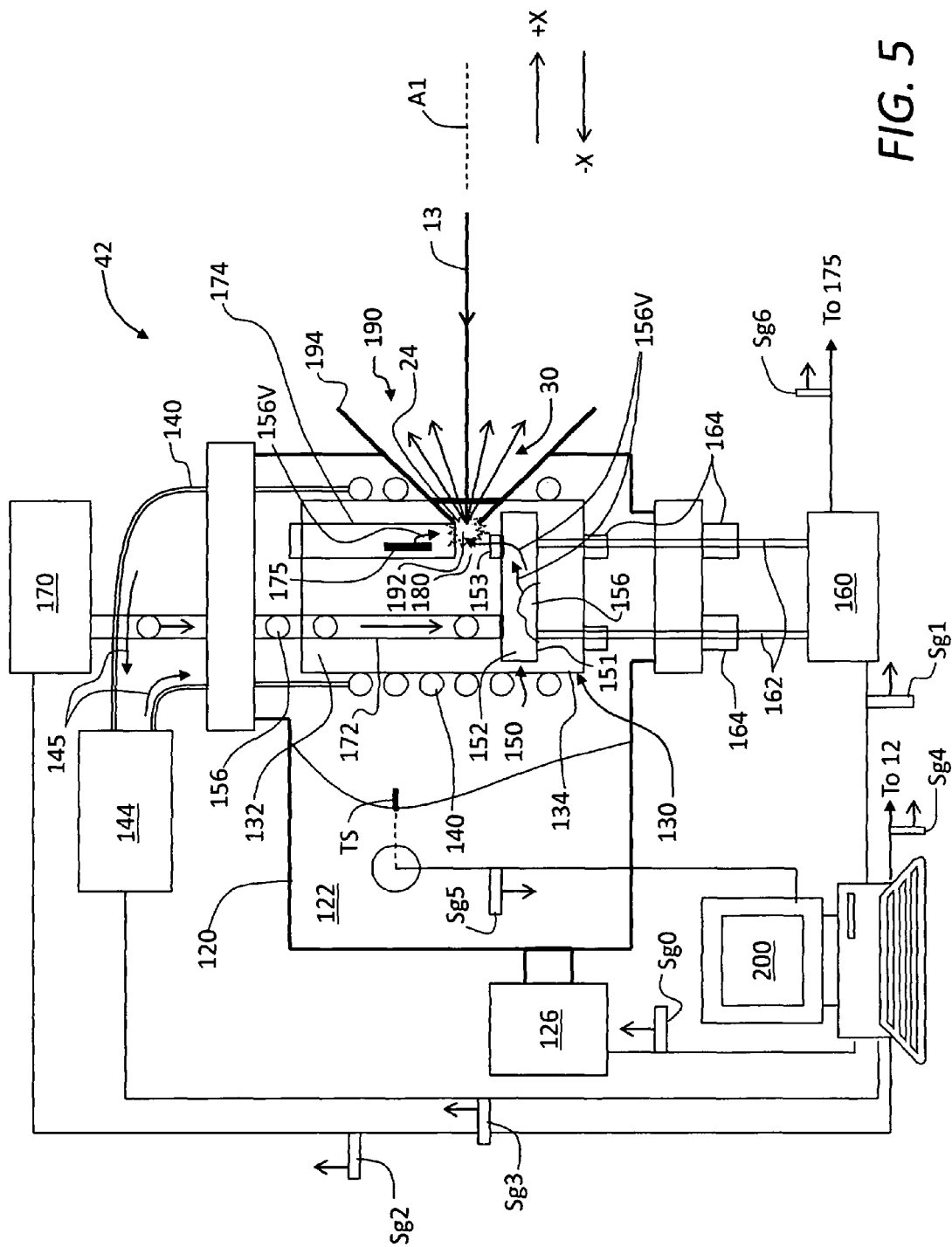
FIG. 5 is a detailed schematic side cutaway view of the target portion of the LPP target system of FIG. 4.

FIG. 5 is a detailed schematic side view of target portion 42 that constitutes a Sn vapor source. Target portion 42 includes a vacuum chamber 120 having an interior 122. A vacuum system 126 is pneumatically coupled to the interior 122 of vacuum chamber 120 and is operable to pull a vacuum therein. Arranged within interior 122 is a containment vessel 130 having an interior 132 defined by vessel walls 134. One or more cooling lines 140 are in thermal contact with vessel walls 134 and are connected to a cooling fluid source 144 to cool containment vessel 130 via the flow of a cooling fluid 145. This cooling provides for a temperature-controlled the interior 132 of containment vessel 130, thus shielding the vacuum chamber 120 from thermal radiation generated by a vapor oven 150.

Target portion 42 includes the vapor oven 150 contained within interior 132 of containment vessel 130 and configured to convert solid or liquid Sn 156 into Sn vapor 156V. Vapor oven 150 is operably connected to a current source 160 via current lines 162. Current source 160 is preferably external to vacuum chamber 120 and current lines 162 pass into the vacuum chamber 120 and containment vessel 130 through feed-throughs 164.

Vapor oven 150 has a housing 151 that defines an interior 152 and that has an opening 153. Housing 151 is configured to receive and contain in interior 152 solid or liquid Sn 156, which in an example is provided to the interior 152 of vapor oven 150 from a Sn source 170, e.g., via an input conduit 172. Solid or liquid Sn 156 may be provided in the form of pellets, for example. An exemplary vapor oven 150 is an evaporation box source, such as is available from R.D. Mathis Company, Long Beach, Calif. An output collector conduit (e.g., a chimney) 174 has one end that interfaces with interior 152 of vapor oven 150 at or adjacent to the opening 153. In an example, output collector conduit 174 is connected at one end to Sn source 170, while in another example it simply is closed off at its far end, as shown. In an example, a heating element 175 is provided in the output collector conduit 174 at or near where the output collector conduit 174 interfaces with vapor oven 150. Heating element 175 is electrically connected to current source 160. An aperture or gap (hereinafter, gap) 180 is defined by end of output collector conduit 174 and housing 151 of vapor oven 150 at opening 153 for reasons described below. For example, gap 180 may be formed in between vapor oven 150 and output collector conduit 174 by not connecting the end of the output collector conduit 174 to the opening 153 of vapor oven 150. In another example, output collector conduit 174 is connected to opening 153 but the output collector conduit 174 itself has gap (e.g., an aperture) 180 formed therein.

An aperture 190 is formed in vacuum chamber 120 and containment vessel 130. In an example, aperture 190 has a conic shape with a narrow end 192 and a wide end 194, with the narrow end 192 at gap 180. In an example, wide end 194 includes a flange (not shown) for connecting to an adjacent vacuum chamber (not shown) associated with the other components of LPP-GIC SOCOMO 100.

In an example, at least one temperature sensor TS is provided in vacuum chamber 120 to monitor the temperature within interior 122 of vacuum chamber 120.

Target portion 42 includes a controller 200 that is operably connected to vacuum system 126, cooling fluid source 144, current source 160, Sn source 170, temperature sensor TS and laser 12 of light source portion 41 of LPP target system 40 (see FIG. 4). An example controller 200 includes a personal computer that can store instructions (software) in a computer readable medium (memory) to cause the computer (via a processor therein) to carry out the instructions to operate LPP target system 40 to generate LPP 24.

With reference to FIG. 4 and FIG. 5, in the operation of LPP target system 40, controller 200 sends a signal Sg0 to vacuum system 126, which causes the vacuum system 126 to pull a vacuum in interior 122 of vacuum chamber 120. Here it is assumed that vacuum chamber 120 is connected to or is part of a larger vacuum chamber (not shown) that houses LPP-GIC SOCOMO 100. Controller 200 also sends a signal Sg1 to current source 160, which in response thereto provides a current to vapor oven 150 via current lines 162. Controller 200 also sends a signal Sg2 to Sn source 170 to cause the Sn source 170 to provide solid or liquid Sn 156 to interior 152 of vapor oven 150 via input conduit 172. Controller 200 further sends a signal Sg3 to cooling fluid source 144 to initiate the flow of cooling fluid 145 through the one or more cooling lines 140. Controller 200 additionally sends a signal Sg4 to laser 12 to initiate the formation of laser beam 13. Controller 200 also receives a temperature signal Sg5 from temperature sensor TS that contains temperature information for interior 122 of vacuum chamber 120. This temperature information is used in one embodiment to control the operation of cooling fluid source 144 to control the temperature of containment vessel 130.

When solid or liquid Sn 156 arrives in interior 152 of vapor oven 150, it is vaporized by the Joule heating of housing 151 from the high electric current provided by current source 160, thereby forming Sn vapor 156V. Thus, in one example, housing 151 presents a high electrical resistance that results in the housing 151 being heating by the current from current source 160. In another example, a heating element (not shown) within housing 151 is used to heat the solid or liquid Sn 156 to form Sn vapor 156V. The Sn vapor 156V then flows out of interior 152 of vapor oven 150 through opening 153 and into gap 180. Laser beam 13 is focused at gap 180 so that the Sn vapor 156V at the gap 180 is irradiated by the focused laser beam 13 and forms LPP 24 (shown in phantom), which emits EUV radiation 30 generally in the +X direction.

The continual flow of Sn vapor 156V into gap 180 allows for high repetition rates and long run times for LPP 24. A small amount of Sn vapor 156V makes it up output collector conduit 174 and is re-directed into gap 180 by the action of heating element 175 while a small amount Sn vapor 156V escapes from gap 180 and flows out of conic aperture 190. However, the amount of Sn debris that needs to be mitigated is minimal because the Sn is provided in gaseous form rather than solid form.

In one example, controller 200 also sends a control signal Sg6 to current source 160, which in response thereto sends current to heating element 175 in output collector conduit 174, thereby causing the heating element 175 to generate heat. This heat serves to keep the density of the Sn vapor 156V in gap 180 relatively high by revaporizing any condensed Sn that forms on the inner walls of the output collector conduit 174 and generally drives the Sn vapor 156V back into the gap 180. As discussed above, temperature signal Sg5 from temperature sensor TS to controller 200 allows the controller 200 to control the temperature of interior 122 of vacuum chamber 120 and containment vessel 130 via the operation of the cooling system (cooling lines 140, cooling fluid source 144 and cooling fluid 145). This in turn allows for the pressure of Sn vapor 156V in gap 180 to be adjusted to control the amount of Sn being converted to EUV radiation 30 in LPP 24.

SOCOMO with No First-Mirror Multilayer

An example configuration of LPP-GIC SOCOMO 100 has no multilayer-coated "first mirror," i.e., the mirror or mirror section upon which EUV radiation 30 is first incident (i.e., first reflected) does not have a multilayer coating 18. In another example configuration of LPP-GIC SOCOMO 100, the first mirror is substantially a grazing incidence mirror. In other embodiments, the first mirror may include a multilayer coating 18.

Figure 6:
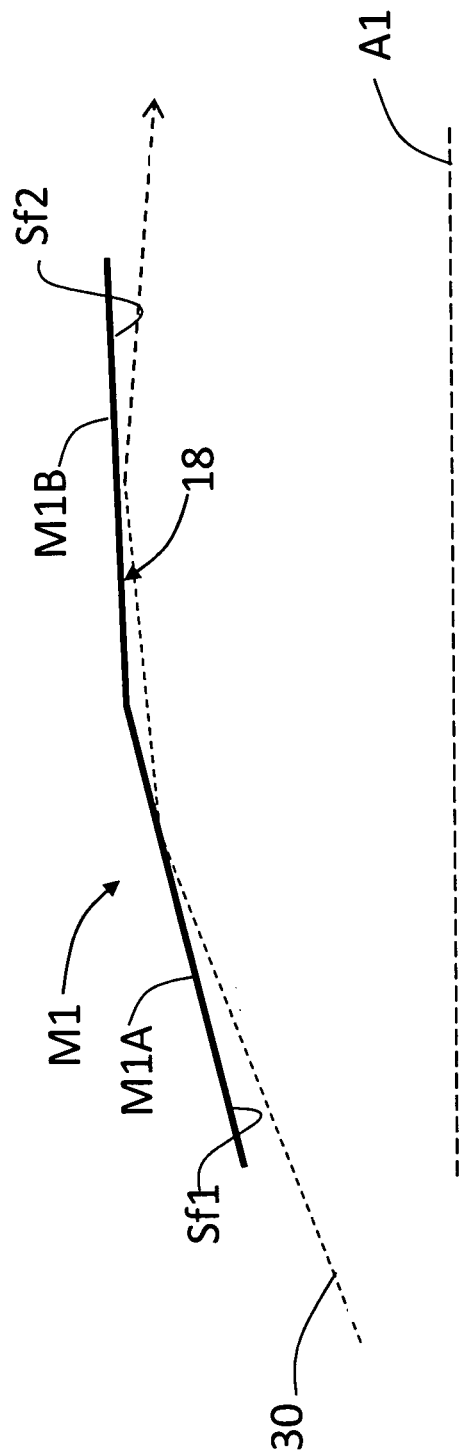
FIG. 6 is a cross-sectional diagram of an example GIC mirror having two sections with respective first and second surfaces that provide first and second reflections of EUV radiation.

A major advantage of LPP-GIC SOCOMO 100 is that its performance is not dependent upon on the survival of a multilayer coated reflective surface. Example embodiments of GIC mirror MG have at least one segmented GIC mirror shell, such as GIC mirror shell M1 shown in FIG. 6. GIC mirror shell M1 is shown as having a two mirror segments M1A and M1B with respective first and second surfaces Sf1 and Sf2. First surface Sf1 provides the first reflection (and is thus the "first mirror") and second surface Sf2 provides a second reflection that is not in the line of sight to LPP 24. In an example embodiment, second surface Sf2 supports a multilayer coating 18 since the intensity of the once-reflected EUV radiation 30 is substantially diminished and is not normally in the line of sight of LPP 24, thus minimizing the amount of ions and neutral atoms incident upon the multilayer coating 18.

GIC vs. NIC SOCOMOs

There are certain trade-offs associated with using a LPP-GIC SOCOMO 100 versus a LPP-NIC SOCOMO 10. For example, for a given collection angle of the EUV radiation 30 from the LPP 24, the LPP-NIC SOCOMO 10 can be designed to be more compact than the LPP-GIC SOCOMO 100.

Also, the LLP-NICSOCOMO 10 can in principle be designed to collect EUV radiation 30 emitted from the Sn source 20 at angles larger than 90° (with respect to the optical axis A1), thus allowing larger collection efficiency. However, in practice this advantage is not normally used because it leads to excessive NIC diameters or excessive angles that the EUV radiation 30 forms with the optical axis A1 at intermediate focus IF.

Also, the far field intensity distribution generated by a LPP-GIC SOCOMO 100 has additional obscurations due to the shadow of the thickness of the GIC mirror shells M1 and M2 and of the mechanical structure supporting the GIC mirrors MG. However, the present disclosure discusses embodiments below where the GIC surface includes a surface correction that mitigates the shadowing effect of the GIC mirror shells thicknesses and improves the uniformity of the focus spot FS at the intermediate focus IF.

Further, the focus spot FS at intermediate focus IF will in general be larger for a LPP-GIC SOCOMO 100 than for a LPP-NIC SOCOMO 10. This size difference is primarily associated with GIC mirror figure errors, which are likely to decrease as the technology evolves.

On the whole, it is generally believed that the above-mentioned trade-offs are far outweighed by the benefits of a longer operating lifetime, reduced cost, simplicity, and reduced maintenance costs and issues associated with a LPP-GIC SOCOMO 100.

Example GIC Mirror for LPP-GIC SOCOMO

Figure 7:
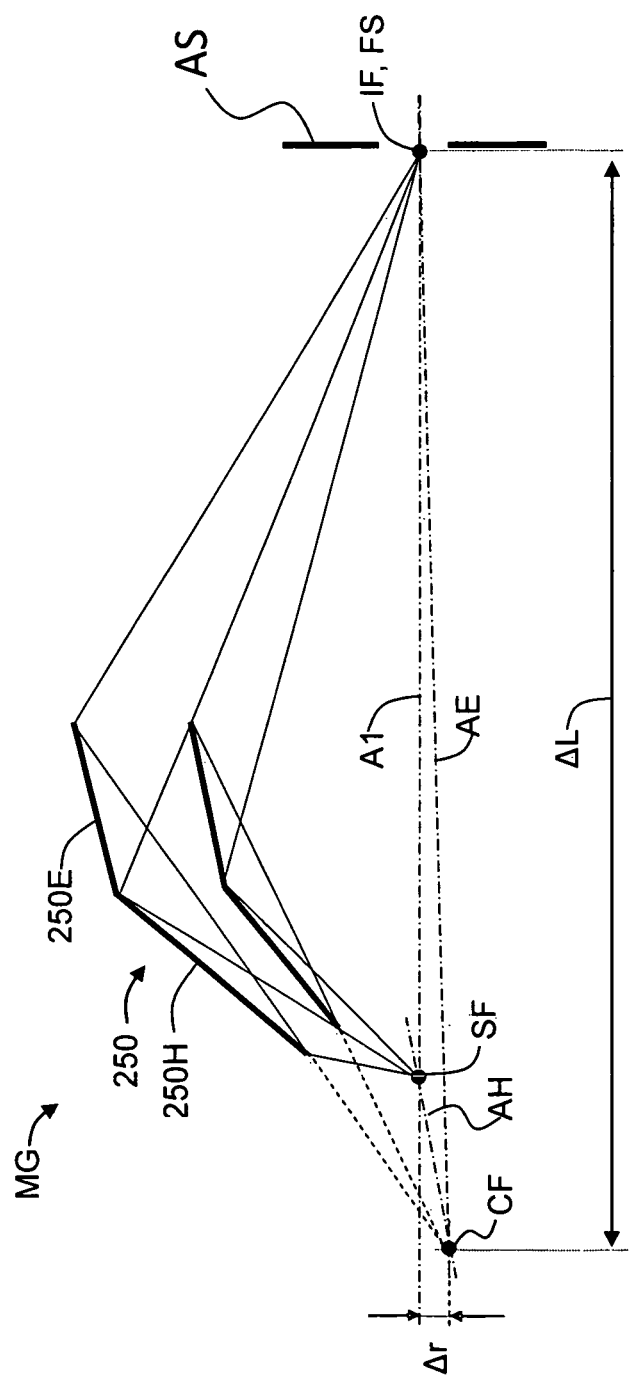
FIG. 7 is a schematic cross-sectional diagram of a portion of an example GIC mirror showing two of the two-section GIC mirror shells used in the outer portion of the GIC mirror.
Figure 8:
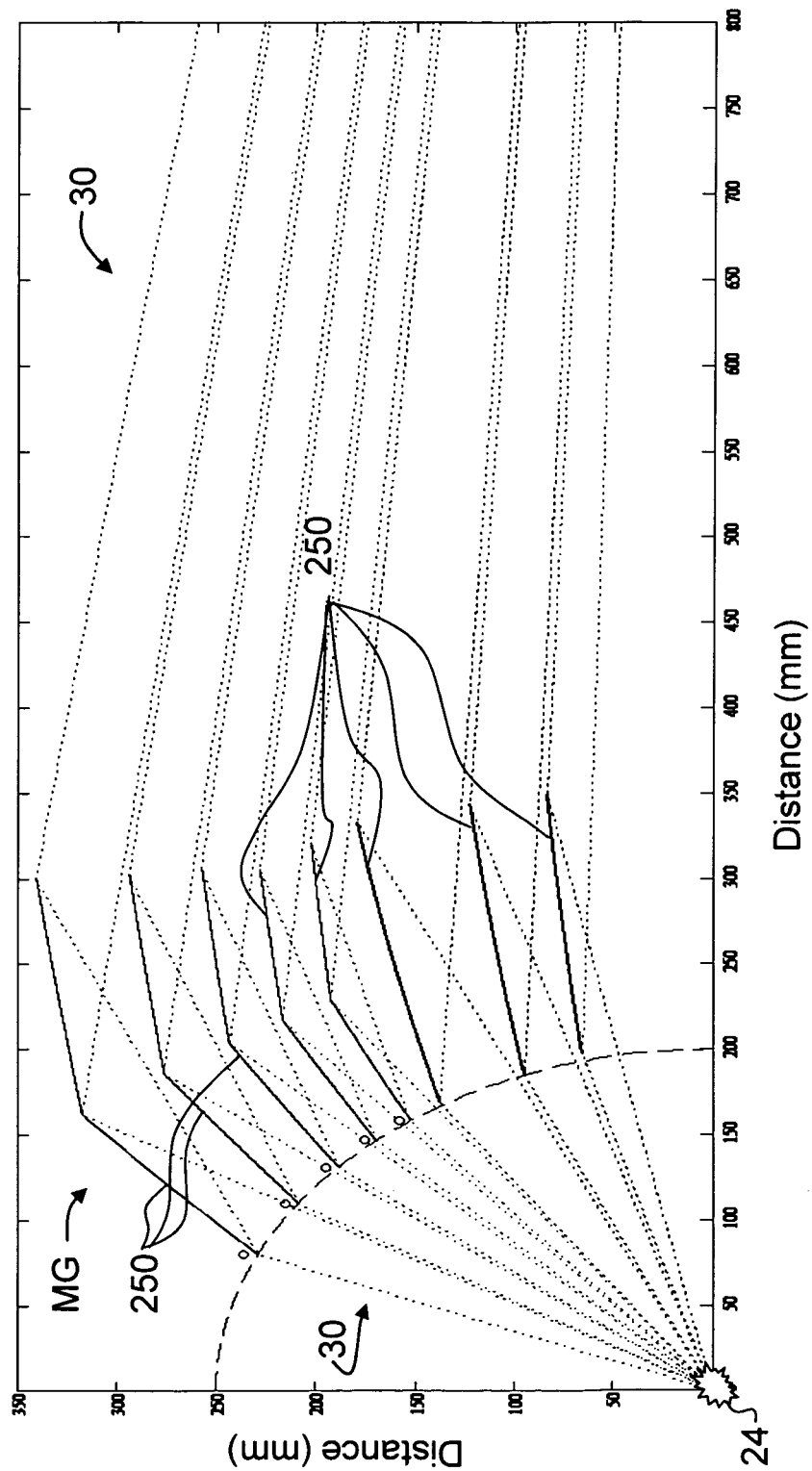
FIG. 8 is a schematic cross-sectional diagram of a portion of the GIC mirror of FIG. 7 showing all eight GIC mirror shells and the LPP.

FIG. 7 is a schematic side view of a portion of an example GIC mirror MG for use in LPP-GIC SOCOMO 100. By way of example, the optical design of GIC mirror MG of FIG. 7 actually consists of eight nested GIC mirror shells 250 with cylindrical symmetry around the optical axis A1, as shown in FIG. 8. To minimize the number of GIC mirror shells 250, in the present example the first three innermost GIC mirror shells 250 are elliptical, whereas the five outermost GIC mirror shells 250 are based on an off-axis double-reflection design having elliptical and hyperbolic cross sections, such as described in European Patent Application Publication No. EP1901126A1, entitled "A collector optical system," which application is incorporated by reference herein. FIG. 7 shows two of the outermost GIC mirror shells 250 having an elliptical section 250E and a hyperboloidal section 250H. FIG. 7 also shows the source focus SF, the virtual common focus CF, and the intermediate focus IF, as well as the axes AE and AH for the elliptical and hyperboloidal sections 250E and 250H of GIC mirror shells 250, respectively. The distance between virtual common focus CF and intermediate focus IF is ΔL. The virtual common focus CF is offset from the optical axis A1 by a distance Δr. The full optical surface is obtained by a revolution of the sections 250E and 250H around the optical axis A1.

Example designs for the example GIC mirror MG are provided in Table 1 and Table 2 below. The main optical parameters of the design are: a) a distance ΔL between LPP 24 and intermediate focus IF of 2400 mm; and b) a maximum collection angle at the LPP side of 70.7°. In an example embodiment, GIC mirror shells 250 each include a Ru coating for improved reflectivity at EUV wavelengths. The nominal collection efficiency of the GIC mirror MG for EUV radiation 30 of wavelength of 13.5 nm when the optical surfaces of GIC mirror shells 250 are coated with Ru is 37.6% with respect to 2π steradians emission from LPP 24.

Since an LPP EUV source is much smaller than a discharge-produced plasma (DPP) EUV source (typically by a factor of 10 in area), the use of LPP 24 allows for better etendue matching between the output of GIC mirror MG and the input of illuminator. In particular, the collection angle at LPP 24 can be increased to very large values with negligible or very limited efficiency loss due to mismatch between the GIC mirror MG and illuminator etendue. In an example embodiment, the collection half-angle can approach or exceed 70°.

The dimension of LPP 24 has a drawback in that the uniformity of the intensity distribution in the far field tend to be worse than for a DPP source, for a given collector optical design. Indeed, since the LLP 24 is smaller, the far-field shadows due to the thicknesses of GIC mirror shells 250 tend to be sharper for an LPP source than for a DPP source.

To compensate at least partially for this effect, a surface figure (i.e., optical profile) correction is added to each GIC mirror shell 250 to improve the uniformity of the intensity distribution in the far field (see, e.g., Publication No. WO2009-095219 A1, entitled "Improved grazing incidence collector optical systems for EUV and X-ray applications," which publication is incorporated by reference herein). Thus, in an example embodiment of GIC mirror MG, each GIC mirror shell 250 has superimposed thereon a polynomial (parabolic) correction equal to zero at the two edges of the GIC mirror shells 250 and having a maximum value of 0.01 mm.

Figure 10:
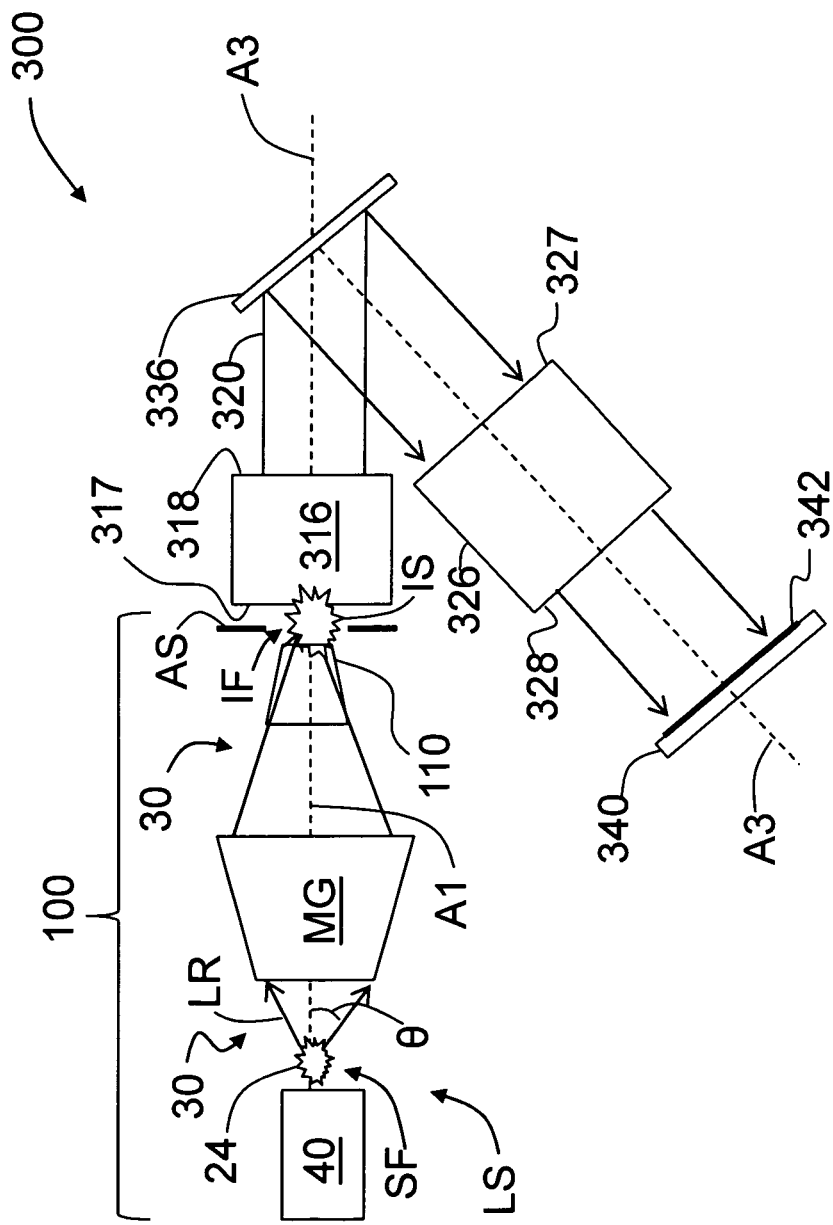
FIG. 10 is a schematic diagram of an EUV lithography system that utilizes the LPP-GIC SOCOMO of the present disclosure.

Table 1 and Table 2 set forth an example design for the GIC mirror MG shown in FIG. 10. The "mirror #" is the number of the particular GIC mirror shell 250 as numbered starting from the innermost GIC mirror shell 250 to the outermost GIC mirror shell 250.

TABLE 1

| Mirror # | Hyperbola Conic Constant | Hyperbola Radius of curvature [mm] | Ellipse Conic Constant | Ellipse Radius of curvature [mm] | Mirror radii [mm] Maximum | Mirror radii [mm] Ellipse-hyperbola joint | Mirror radii [mm] Minimum |
|---|---|---|---|---|---|---|---|
| 1 | — | — | −0.990478 | 11.481350 | 83.347856 | — | 65.369292 |
| 2 | — | — | −0.979648 | 24.674461 | 122.379422 | — | 94.644337 |
| 3 | — | — | −0.957302 | 52.367323 | 179.304368 | — | 137.387744 |
| 4 | −1.066792 | 29.401382 | −0.963621 | 61.100890 | 202.496127 | 192.634298 | 152.384167 |
| 5 | −1.072492 | 34.268782 | −0.949865 | 86.379783 | 228.263879 | 216.839614 | 169.639161 |
| 6 | −1.090556 | 46.865545 | −0.941216 | 104.704248 | 257.297034 | 243.541412 | 188.559378 |
| 7 | −1.111163 | 61.694607 | −0.926716 | 134.626393 | 293.432077 | 276.198514 | 208.671768 |
| 8 | −1.134540 | 81.393448 | −0.905453 | 180.891785 | 340.258110 | 317.294990 | 229.102808 |

TABLE 2

| | Position of virtual common focus CF with respect to intermediate focus IF | |
|---|---|---|
| Mirror # | ΔL, parallel to optical axis A1 [mm] | Δr, transverse to optical axis A1 [mm] |
| 1 | — | — |
| 2 | — | — |
| 3 | — | — |
| 4 | 3293.000000 | 171.500000 |
| 5 | 3350.000000 | 237.000000 |
| 6 | 3445.000000 | 276.300000 |
| 7 | 3521.000000 | 335.250000 |
| 8 | 3616.000000 | 426.950000 |

Figure 9B:
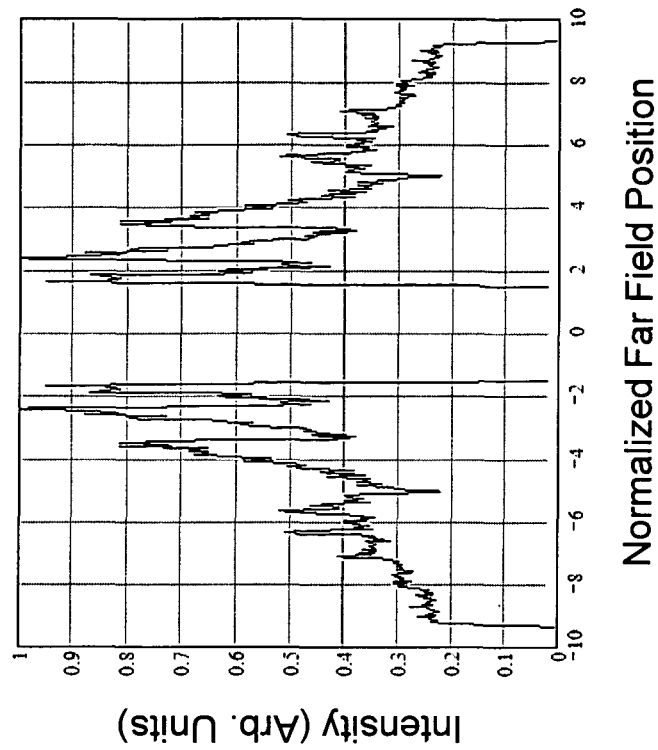
FIG. 9B is the same plot as FIG. 9A but with a polynomial surface-figure correction that improves the far-field image uniformity.
Figure 9A:
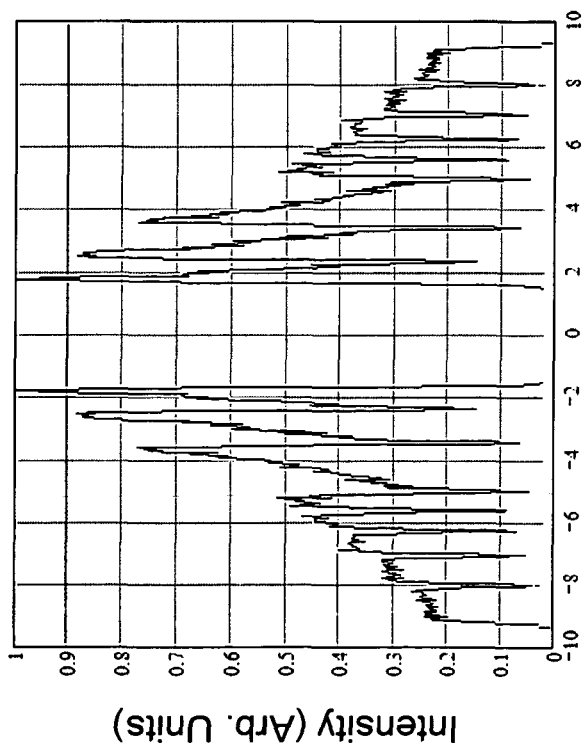
FIG. 9A is a plot of the normalized far-field position vs. Intensity (arbitrary units) for the case where the GIC mirror shells do not include a polynomial surface-figure correction to improve the far-field image uniformity.

FIG. 9A is a plot of the normalized far-field position at the intermediate focus IF vs. intensity (arbitrary units) for light rays incident thereon for the case where there is no correction of the GIC shell profile. The plot is a measure of the uniformity of the intermediate image (i.e., "focus spot" FS) of LPP 24 as formed at the intermediate focus IF. LPP 24 is modeled as a sphere with a 0.2 mm diameter.

FIG. 9B is the same plot except with the above-described correction added to GIC mirror shells 250. The comparison of the two plots of FIG. 9A and FIG. 9B shows substantially reduced oscillations in intensity in FIG. 9B and thus a significant improvement in the far field uniformity the focus spot FS at the intermediate focus IF as a result of the corrected surface figures for the GIC mirror shells 250.

EUV Lithography System with LPP-GIC SOCOMO

FIG. 10 is an example EUV lithography system ("lithography system") 300 according to the present disclosure. Example lithography systems 300 are disclosed, for example, in U.S. Patent Applications No. US2004/0265712A1, US2005/0016679A1 and US2005/0155624A1, which are incorporated herein by reference.

Lithography system 300 includes a system axis A3 and an EUV light source LS that includes LPP-GIC SOCOMO 100 with optical axis A1 and having the Sn vapor-based LPP target system 40 as described above, which generates LPP 24 that emits working EUV radiation 30 at λ=13.5 nm.

LPP-GIC SOCOMO 100 includes GIC mirror MG and optional RCED 110 as described above. In an example embodiment, GIC mirror MG is cooled as described in U.S. patent application Ser. No. 12/592,735, which is incorporated by reference herein. Also in an example, RCED 110 is cooled.

GIC mirror MG is arranged adjacent and downstream of EUV light source LS, with optical (collector) axis A1 lying along system axis A3. GIC mirror MG collects working EUV radiation 30 (i.e., light rays LR) from EUV light source LS located at source focus SF and the collected radiation forms intermediate source image IS (i.e., a focus spot) at intermediate focus IF. RCED 110 serves to enhance the collection of EUV radiation 30 by funneling to intermediate focus IF the EUV radiation 30 that would not otherwise make it to the intermediate focus IF. In an example, LPP-GIC SOCOMO 100 comprises LPP target system 40, GIC mirror MG and RCED 110.

An illumination system 316 with an input end 317 and an output end 318 is arranged along system axis A3 and adjacent and downstream of GIC mirror MG with the input end adjacent the GIC mirror MG. Illumination system 316 receives at input end 317 EUV radiation 30 from source image IS and outputs at output end 318 a substantially uniform EUV radiation beam 320 (i.e., condensed EUV radiation). Where lithography system 300 is a scanning type system, EUV radiation beam 320 is typically formed as a substantially uniform line of EUV radiation 30 at reflective reticle 336 that scans over the reflective reticle 336.

A projection optical system 326 is arranged along (folded) system axis A3 downstream of illumination system 316. Projection optical system 326 has an input end 327 facing output end 318 of illumination system 316, and an opposite output end 328. A reflective reticle 336 is arranged adjacent the input end 327 of projection optical system 326 and a semiconductor wafer 340 is arranged adjacent the output end 328 of projection optical system 326. Reflective reticle 336 includes a pattern (not shown) to be transferred to semiconductor wafer 340, which includes a photosensitive coating (e.g., photoresist layer) 342. In operation, the uniformized EUV radiation beam 320 irradiates reflective reticle 336 and reflects therefrom, and the pattern thereon is imaged onto photosensitive coating 342 of semiconductor wafer 340 by projection optical system 326. In a scanning type lithography system 300, the reflective reticle image scans over the photosensitive coating 342 to form the pattern over the exposure field. Scanning is typically achieved by moving reflective reticle 336 and semiconductor wafer 340 in synchrony.

Once the reticle pattern is imaged and recorded on semiconductor wafer 340, the patterned semiconductor wafer 340 is then processed using standard photolithographic and semiconductor processing techniques to form integrated circuit (IC) chips.

Note that in general the components of lithography system 300 are shown lying along a common folded system axis A3 in FIG. 10 for the sake of illustration. One skilled in the art will understand that there is often an offset between entrance and exit axes for the various components such as for illumination system 316 and for projection optical system 326.

It will be apparent to those skilled in the art that various modifications and variations can be made to the present disclosure without departing from the spirit and scope of the disclosure. Thus it is intended that the present disclosure cover the modifications and variations of this disclosure provided they come within the scope of the appended claims and their equivalents.

What is claimed is:

1. A source-collector module for an extreme ultraviolet (EUV) lithography system, comprising:
   a laser that generates a pulsed laser beam;
   a fold mirror arranged along a source-collector module axis and configured to receive the laser beam and reflect the laser beam down the source-collector module axis in a first direction;
   a Sn vapor source comprising a vapor oven having an interior and configured to convert liquid Sn or solid Sn in the vapor oven interior to Sn vapor and provide the Sn vapor to a gap where the Sn vapor is irradiated by the pulsed laser beam, thereby creating a laser-produced plasma (LPP) that generates EUV radiation in a second direction that is generally opposite the first direction; and
   a grazing-incidence collector (GIC) mirror having an input end and an output end and arranged to receive the EUV radiation at the input end and focus the received EUV radiation at an intermediate focus adjacent the output end.

2. The source-collector module of claim 1, further comprising:
   a vacuum chamber having a chamber interior;
   a temperature-controlled containment vessel arranged within the chamber interior, the containment vessel having a containment vessel interior that contains the vapor oven; and
   an aperture formed in the vacuum chamber and containment vessel, the aperture having first and second ends with the first end arranged adjacent the gap, and wherein the laser beam travels through the conic aperture from the second end to the first end and to the Sn vapor in the gap.

3. The source-collector module of claim 2, further comprising:
   a Sn source that contains Sn in liquid or solid form, wherein the Sn source is operably coupled to the vapor oven to provide liquid or solid Sn to the vapor oven interior.

4. The source-collector module of claim 3, the vapor oven further comprising a vapor oven housing having an opening located adjacent the gap to allow vapor to flow from the vapor oven interior into the gap.

5. The source-collector module of claim 4, further comprising:
   an output conduit having first and second ends, with the first end operably connected at one end to the Sn source, and the second end interfaced with the opening, thereby defining the gap.

6. The source collector module of claim 5, further comprising a heating element arranged in the output conduit adjacent the gap and configured to reduce condensation of the Sn vapor in the output conduit.

7. The source-collector module of claim 1, further comprising:
   a current source electrically connected to the vapor oven and configured to provide an electrical current to the vapor oven to heat the vapor oven to form the Sn vapor from the Sn liquid or Sn solid.

8. The source-collector module of claim 1, further comprising a radiation collection enhancement device (RCED) arranged between the GIC mirror output end and the intermediate focus, the RCED configured to direct a portion of the EUV radiation to the intermediate focus that would not otherwise be directed to the intermediate focus.

9. The source-collector module of claim 8, wherein the radiation-enhancement collection device has an input end, an output end and a tapered inner surface that narrows in a direction from the input end to the output end, and where the RCED is axially arranged along the source-collector module axis with its output end arranged adjacent the intermediate focus.

10. The source-collector module of claim 1, wherein the GIC mirror provides a first reflecting surface that does not have a multilayer coating.

11. The source-collector module of claim 1, wherein the GIC mirror includes a Ru coating.

12. The source-collector module of claim 1, wherein the GIC mirror includes a multilayer coating.

13. The source-collector module of claim 1, wherein the GIC mirror includes at least one segmented GIC shell having a first reflecting surface with no multilayer coating and a second reflecting surface having a multilayer coating.

14. An extreme ultraviolet (EUV) lithography system for illuminating a reflective mask, comprising:
   the source-collector module of claim 1;
   an illuminator configured to receive the focused EUV radiation formed at the intermediate focus and form condensed EUV radiation for illuminating the reflective reticle.

15. The EUV lithography system of claim 14, further comprising a radiation collection enhancement device (RCED) arranged between the GIC mirror output end and the intermediate focus, the RCED configured to direct a portion of the EUV radiation to the intermediate focus that would not otherwise be directed to the intermediate focus.

16. The EUV lithography system of claim 15 for forming a patterned image on a photosensitive semiconductor wafer, further comprising:
   a projection optical system arranged downstream of the reflective reticle and configured to receive reflected EUV radiation from the reflective reticle and form therefrom the patterned image on the photosensitive semiconductor wafer.

17. A method of collecting extreme ultraviolet (EUV) radiation from a laser-produced plasma (LPP), comprising:
   providing a grazing incidence collector (GIC) mirror along an axis, the GIC mirror having input and output ends;
   arranging adjacent the GIC mirror input end an LPP target system comprising a vapor oven arranged within a vacuum chamber and configured to generate Sn vapor, and generating Sn vapor with said vapor oven so that Sn vapor is provided to a gap accessible to a pulsed laser beam;
   sending the pulsed laser beam down the GIC axis and through the GIC from the output end to the input end and to the Sn vapor, thereby forming the LPP that emits the EUV radiation; and
   collecting with the GIC mirror at the GIC input end a portion of the EUV radiation from the LPP and directing the collected EUV radiation out of the GIC mirror output end to form a focus spot at an intermediate focus.

18. The method of claim 17, further comprising:
   providing a radiation collection enhancement device (RCED) arranged between the GIC mirror output end and the intermediate focus; and
   directing with the RCED a portion of the EUV radiation to the intermediate focus that would not otherwise be directed to the intermediate focus.

19. The method of claim 17, further comprising:
providing the GIC mirror with a first reflecting surface that does not have a multilayer coating.

20. The method of claim 17, further comprising providing the GIC mirror with a Ru coating.

21. The method of claim 17, further comprising providing the GIC mirror with a multilayer coating.

22. The method of claim 17, further comprising:
providing the GIC mirror with at least one segmented GIC shell that includes a first reflecting surface and a second reflecting surface, with the second reflecting surface having the multilayer coating.

23. The method of claim 18, further comprising:
forming from EUV radiation at the intermediate focus condensed EUV radiation for illuminating a reflective reticle.

24. The method of claim 23, further comprising:
receiving reflected EUV radiation from the reflective reticle and form therefrom the patterned image on the photosensitive semiconductor wafer using a projection optical system.

25. A laser produced plasma (LPP) target system, comprising:
a laser that generates a pulsed laser beam;
a vacuum chamber having a chamber interior;
a temperature-controlled containment vessel arranged in the chamber interior and having a containment vessel interior;
a vapor oven arranged in the containment vessel interior and having a housing that includes an opening and that defines an vapor oven interior, the vapor oven being configured to convert solid or liquid Sn in the vapor oven interior to Sn vapor, which flows out of the vapor oven interior through the opening and into a gap accessible to the pulsed laser beam; and
an aperture formed in the vacuum chamber and containment vessel, the aperture configured so that the laser beam can travel through the aperture and to the Sn vapor that passes through the opening and into the gap.

26. The system of claim 25, further comprising:
a Sn source that contains Sn in liquid or solid form, the Sn source operably connected to the vapor oven to provide liquid or solid Sn to the vapor oven interior.

27. The system of claim 26, further comprising:
a current source electrically connected to the vapor oven and configured to provide an electrical current to the vapor oven to heat the vapor oven to form the Sn vapor from the Sn liquid or Sn solid.

* * * * *